(12) United States Patent
McLellan et al.

(10) Patent No.: US 7,732,914 B1
(45) Date of Patent: Jun. 8, 2010

(54) CAVITY-TYPE INTEGRATED CIRCUIT PACKAGE

(76) Inventors: Neil McLellan, 110 Woodranch Cr., Danville, CA (US) 94539; Katherine Wagenhoffer, 34523 Torrey Pine Ln, Union City, CA (US) 94587; Geraldine Tsui Yee Lin, Rm. 1510, Yiu Tung Hse, Tung Tau Est, KLN (HK); Mohan Kirloskar, 7712 Oak Meadow Ct., Cupertino, CA (US) 95014

( * ) Notice: Subject to any disclaimer, the term of this patent is extended or adjusted under 35 U.S.C. 154(b) by 579 days.

(21) Appl. No.: 10/985,233

(22) Filed: Nov. 10, 2004

Related U.S. Application Data

(63) Continuation-in-part of application No. 10/232,678, filed on Sep. 3, 2002, now Pat. No. 6,821,817.

(51) Int. Cl.
*H01L 23/495* (2006.01)

(52) U.S. Cl. .............. 257/704; 257/E31.117; 257/711; 257/676; 257/712; 257/713; 257/706; 257/698; 257/666

(58) Field of Classification Search .......... 257/E31.117, 257/666, 106, 676, 712, 713, 717, 720, 706, 257/704, 698
See application file for complete search history.

(56) References Cited

U.S. PATENT DOCUMENTS

| | | | |
|---|---|---|---|
| 4,530,152 A | 7/1985 | Roche et al. | |
| 4,584,767 A | 4/1986 | Gregory | |
| 4,685,998 A | 8/1987 | Quinn et al. | |
| 4,710,419 A | 12/1987 | Gregory | |
| 4,812,896 A | 3/1989 | Rothgery et al. | |
| 5,066,831 A | 11/1991 | Spielerger et al. | |
| 5,138,431 A | 8/1992 | Huang et al. | |
| 5,157,480 A | 10/1992 | McShane et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,221,642 A | 6/1993 | Burns | |
| 5,273,938 A | 12/1993 | Lin et al. | |
| 5,277,972 A | 1/1994 | Sakumoto et al. | |
| 5,279,029 A | 1/1994 | Burns | |
| 5,289,034 A | 2/1994 | Hundt | |
| 5,293,072 A | 3/1994 | Tsuji et al. | |
| 5,332,864 A | 7/1994 | Liang et al. | |
| 5,343,076 A | 8/1994 | Katayama et al. | |

(Continued)

FOREIGN PATENT DOCUMENTS

JP          59-208756          11/1984

*Primary Examiner*—Alexander O Williams
(74) *Attorney, Agent, or Firm*—Mitchell M. Wong; The Exeter Law Group LLP

(57) ABSTRACT

A process for fabricating a cavity-type integrated circuit includes supporting a leadframe strip in a mold. The leadframe strip includes a die attach pad and a row of contact pads circumscribing the die attach pad. A package body is molded in the mold such that opposing surfaces of the die attach pad and of the contact pads are exposed. A semiconductor die is mounted to the die attach pad. Various ones of the contact pads are wire bonded to the semiconductor die and a lid is mounted on the package body to thereby enclose the semiconductor die and the wire bonds in a cavity of the integrated circuit package.

4 Claims, 5 Drawing Sheets

U.S. PATENT DOCUMENTS

| | | |
|---|---|---|
| 5,366,933 A | 11/1994 | Golwalkar et al. |
| 5,406,124 A | 4/1995 | Morita et al. |
| 5,424,576 A | 6/1995 | Djennas et al. |
| 5,444,301 A | 8/1995 | Song et al. |
| 5,457,340 A | 10/1995 | Templeton, Jr. et al. |
| 5,474,958 A | 12/1995 | Djennas et al. |
| 5,483,099 A | 1/1996 | Natarajan et al. |
| 5,545,922 A | 8/1996 | Golwalkar et al. |
| 5,604,376 A | 2/1997 | Hamburgen et al. |
| 5,608,267 A | 3/1997 | Mahulikar et al. |
| 5,639,990 A | 6/1997 | Nishihara et al. |
| 5,640,047 A | 6/1997 | Nakashima |
| 5,641,997 A | 6/1997 | Ohita et al. |
| 5,646,831 A | 7/1997 | Manteghi |
| 5,650,663 A | 7/1997 | Parthasarathi |
| 5,683,806 A | 11/1997 | Sakumoto et al. |
| 5,696,666 A | 12/1997 | Miles et al. |
| 5,700,697 A | 12/1997 | Dlugokecki |
| 5,701,034 A | 12/1997 | Marrs |
| 5,710,064 A | 1/1998 | Song et al. |
| 5,710,695 A | 1/1998 | Manteghi |
| 5,777,382 A | 7/1998 | Abbott et al. |
| 5,846,477 A | 12/1998 | Hotta et al. |
| 5,869,833 A | 2/1999 | Mehringer et al. |
| 5,894,108 A | 4/1999 | Mostafazadeh et al. |
| 5,900,676 A | 5/1999 | Kweon et al. |
| 5,910,686 A | 6/1999 | Hamzehdoost et al. |
| 5,976,912 A | 11/1999 | Fukutomi et al. |
| 6,001,671 A | 12/1999 | Fjelstad |
| 6,057,601 A | 5/2000 | Lau et al. |
| 6,081,029 A | 6/2000 | Yamaguchi |
| 6,093,584 A | 7/2000 | Fjelstad |
| 6,124,637 A | 9/2000 | Freyman et al. |
| 6,144,571 A | 11/2000 | Sasaki et al. |
| 6,146,924 A | 11/2000 | Chang et al. |
| 6,194,786 B1 | 2/2001 | Orcutt |
| 6,211,462 B1 | 4/2001 | Carter et al. |
| 6,229,200 B1 | 5/2001 | McLellan et al. |
| 6,238,952 B1 | 5/2001 | Lin |
| 6,294,100 B1 | 9/2001 | Fan et al. |
| 6,294,830 B1 | 9/2001 | Fjelstad |
| 6,306,685 B1 | 10/2001 | Liu et al. |
| 6,335,224 B1 | 1/2002 | Peterson et al. |
| 6,372,539 B1 | 4/2002 | Bayan et al. |
| 6,459,163 B1 | 10/2002 | Bai |
| 6,489,557 B2 | 12/2002 | Eskildsen et al. |
| 6,498,099 B1 | 12/2002 | McLellan et al. |
| 6,518,501 B1 * | 2/2003 | Kawahara et al. ........... 174/538 |
| 6,528,877 B2 | 3/2003 | Ernst et al. |
| 6,545,347 B2 | 4/2003 | McClellan |
| 6,577,000 B2 | 6/2003 | Sato et al. |
| 6,585,905 B1 | 7/2003 | Fan et al. |
| 6,586,677 B2 | 7/2003 | Glenn |
| 6,635,957 B2 | 10/2003 | Kwan et al. |
| 6,643,919 B1 * | 11/2003 | Huang ......................... 29/827 |
| 6,762,118 B2 | 7/2004 | Liu et al. |
| 6,821,821 B2 | 11/2004 | Fjelstad |
| 7,067,963 B2 * | 6/2006 | Tsuda et al. ................. 310/348 |
| 7,242,068 B2 * | 7/2007 | Huang ......................... 257/433 |
| 2003/0015780 A1 | 1/2003 | Kang et al. |
| 2004/0148772 A1 * | 8/2004 | Hsieh et al. .................... 29/855 |
| 2005/0236644 A1 * | 10/2005 | Getten et al. ................. 257/106 |
| 2006/0197197 A1 * | 9/2006 | Tsuda et al. .................. 257/666 |
| 2007/0108561 A1 * | 5/2007 | Webster et al. .............. 257/666 |

* cited by examiner

US 7,732,914 B1

CAVITY-TYPE INTEGRATED CIRCUIT PACKAGE

CROSS REFERENCE TO RELATED APPLICATIONS

This application is a continuation-in-part of U.S. patent application Ser. No. 10/232,678, filed Sep. 3, 2002, now U.S. Pat. No. 6,821,817, issued Nov. 23, 2004.

FIELD OF THE INVENTION

The present invention relates in general to integrated circuit packaging, and more particularly to a cavity-type integrated circuit package.

BACKGROUND OF THE INVENTION

Cavity-type IC packages are useful in imaging devices such as CMOS imaging or CCD display applications for still or video cameras. The package includes a die at the base of a cavity and a clear lid epoxied on top. The use of a cavity-type IC package is advantageous for high frequency applications as the gold interconnect wires between the die attach pad and the contacts span an air gap rather than travelling through mold compound. The air has a lower dielectric constant than the mold compound and therefore the electrical impedance of the gold wire is much lower when the wire runs through air rather than through the mold compound. Thus signal distortion at high frequencies is inhibited.

Prior art cavity-type IC packages include ceramic body IC packages such as the Ceramic PGA cavity package traditionally used for microprocessors. However, these packages are cost prohibitive.

Other prior art packages include ball grid array (BGA) packages for use in imaging or camera applications. These packages are fabricated with a rim of high viscosity epoxy and a glass lid placed thereon. Again, these packages are cost prohibitive as they employ a substrate rather than a less-expensive leadframe.

The PANDA PACK, a well-known QFP (Quad Flat Pack) cavity style package, provides an air gap spanned by the gold interconnect wires. However, the inner leads of these packages are not supported and the mold flash must be cleaned from the leads for the gold wire to stick to the inner leads during wire bonding. Cleaning and wire bonding is difficult and therefore is not always successful.

Further improvements are driven by industry demands for increased electrical performance and decreased size and cost of manufacture.

SUMMARY OF THE INVENTION

According to one aspect of the present invention, there is provided a process for fabricating a cavity-type integrated circuit that includes supporting a leadframe strip in a mold. The leadframe strip includes a die attach pad and a row of contact pads circumscribing the die attach pad. A package body is molded in the mold such that opposing surfaces of the die attach pad and of the contact pads are exposed. A semiconductor die is mounted to the die attach pad. Various ones of the contact pads are wire bonded to the semiconductor die and a lid is mounted on the package body to thereby enclose the semiconductor die and the wire bonds in a cavity of the integrated circuit package.

According to another aspect of the present invention, there is provided a cavity-type integrated circuit package that includes a premolded package body including a die attach pad, a plurality of contact pads and a molding material. An outer surface of the package body includes an exposed surface of the die attach pad. A semiconductor die is mounted to a first side of a die attach pad and a plurality of wire bonds connect various ones of the contact pads and the semiconductor die. A lid is mounted on the package body, thereby enclosing the semiconductor die and the wire bonds in a cavity defined by the package body and the lid.

In one aspect of the invention, an air cavity in the interior of the package body and the clamped portion of the contacts inhibits mold flash from contaminating a surface thereof, providing a clean wire bondable surface.

Advantageously, the cavity integrated circuit package according to an aspect of the present invention includes wire bonds that span air which has a low dielectric constant compared to molding compound, providing lower electrical impedance of the wire bonds and reduced signal distortion at high frequencies.

BRIEF DESCRIPTION OF THE DRAWINGS

The present invention will be better understood with reference to the drawings and to the following description, in which.

DETAILED DESCRIPTION OF THE PREFERRED EMBODIMENTS

Figure 1A:
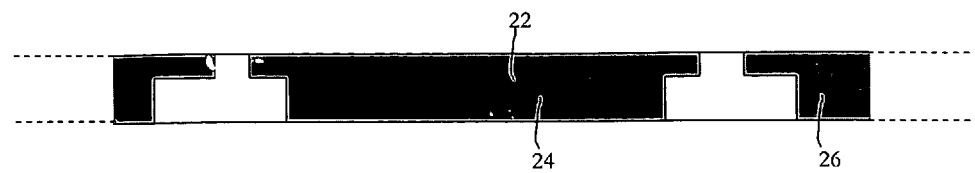
FIGS. 1A to 1H show processing steps for fabricating a cavity-type integrated circuit package according to an embodiment of the present invention.

Referring to the figures, a process for fabricating a cavity-type integrated circuit package is described. The integrated circuit package is indicated generally by the numeral 20. The process includes supporting a leadframe strip 22 in a mold. The leadframe strip 22 includes a die attach pad 24 and a row of contact pads 26 circumscribing the die attach pad 24. A package body 28 is molded in the mold such that opposing surfaces of the die attach pad 24 and of the contact pads 26 are exposed. A semiconductor die 30 is mounted to the die attach pad 24. Various ones of the contact pads 26 are wire bonded to the semiconductor die 30 and a lid 32 is mounted on the package body 28 to thereby enclose the semiconductor die 30 and the wire bonds 34 in a cavity of the integrated circuit package 20.

For ease of understanding, the figures provided and described herein show the basic steps in fabricating the cavity-type integrated circuit package 20 according to the present invention.

Referring to FIG. 1A, a leadframe strip 22 is provided. It will be understood that the leadframe strip 22 is fabricated from a copper panel substrate that has been subjected to a selective wet etch process to provide the leadframe strip 22 shown in FIG. 1A. The leadframe strip 22 is then plated with a suitable metal or metals such as silver (Ag), nickel and gold (Ni/Au), nickel and palladium (Ni/Pd) or nickel, palladium and gold (Ni/Pd/Au), to facilitate wire bonding. As described in greater detail in Applicant's U.S. Pat. No. 6,229,200, issued May 8, 2001, the contents of which are hereby incorporated by reference, the leadframe strip 22 includes a plurality of sections, each of which incorporates a plurality of leadframe units in an array (e.g. 3×3 array, 5×5 array, etc.) Only such unit is depicted in the Figures, adjacent units being indicated by stippled lines. It will be appreciated that the adjacent units of the leadframe strip are similar to the unit depicted. Reference is made to a single unit throughout the following description for the purpose of simplicity. It will be understood, however, that the process described is carried out in the fabrication of each of the units in the array.

The leadframe strip 22 includes a die attach pad 24 and a plurality of contact pads 26 that circumscribe the die attach pad 24 in each unit thereof. The die attach pad 24 is held at the four corners thereof by tie bars (not shown) on the leadframe strip 22. As shown in FIG. 1, the die attach pad 24 and the contact pads 26 each include a peripheral lip.

Figure 1B:
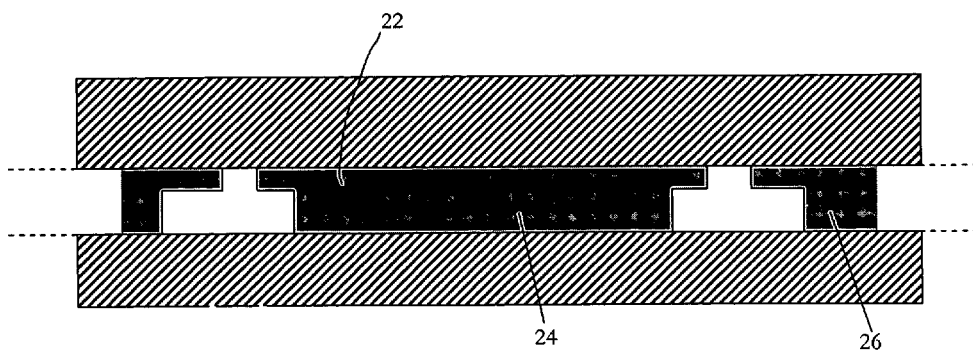

The leadframe strip 22 is supported in a mold by clamping the leadframe between upper and lower mold dies as shown in FIG. 1B. In the present embodiment, the upper mold die has a generally flat surface in contact with the upper surfaces of the die attach pad 24 and the contact pads 26. Similarly, the lower mold die has a generally flat surface in contact with the lower surfaces of the die attach pad 24 and the contact pads 26.

Figure 1C:
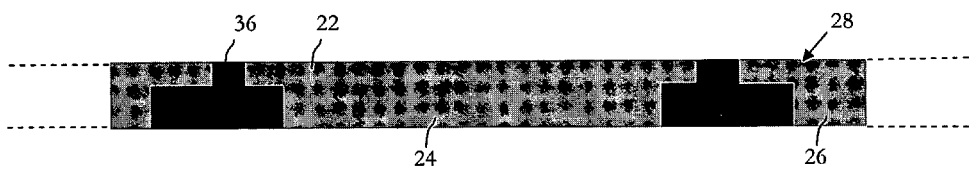
Figure 1D:
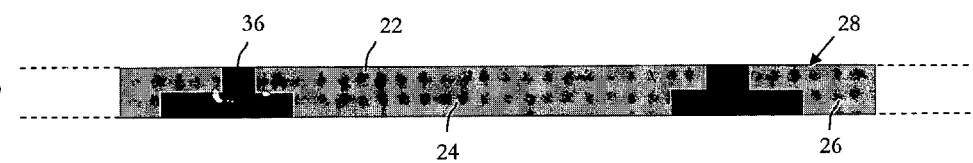

The package body 28 is then molded using a suitable molding material 36 and the package body 28 is removed from the mold. As shown in FIG. 1C, the resulting package body 28 is in the form of a generally flat strip including the leadframe strip 22 and the molding material 36. The surfaces of the die attach pad 24 and the contact pads 26 that are in contact with the upper and lower mold dies by clamping, are thereby protected and mold flash is inhibited from contaminating these surfaces during molding.

Each peripheral lip on the die attach pad 24 and the contact pads 26 increases surface area in contact with the molding material 36 of the package body 28 and acts as mold interlocking features for secure engagement between the contact pads 26 and the molding material 36 and between the die attach pad 24 and the molding material 36.

A back surface of the package body 28 is then ground down using a wafer back grinding technique (FIG. 1D), as would be understood by those of skill in the art to grind the package body 28 to a suitable thickness.

Figure 1E:
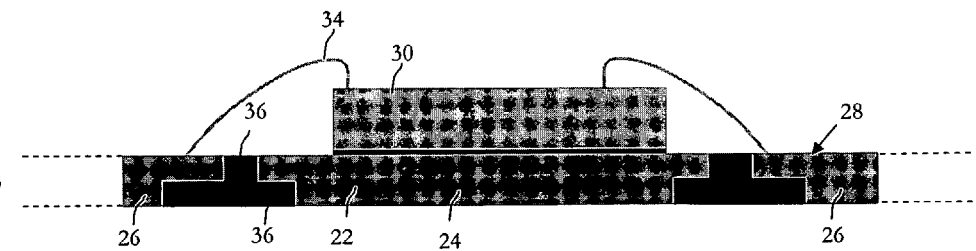

Next, a semiconductor die 30 is fixed to the die attach pad 24 using conventional techniques, for example using epoxy or film. This is followed by wire bonding of the contact pads 26 to the semiconductor die 30, using gold wire bonds 34 (FIG. 1E). Clearly the wire bonds 34 are connected to interior portions of the contact pads 26 (at portions of the contact pads 26 that are interior of the package cavity after mounting of the lid 32).

Figure 1F:
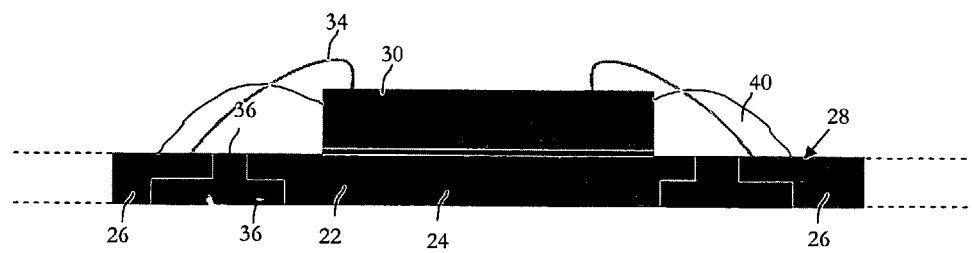

Referring now to FIG. 1F, a glob-top fill 40 is added to cover a portion of the wire bonds 34, at the contact pads 26. The glob-top fill 40 is an epoxy resin for mechanically supporting the package and protecting the wire bonds 34 and the die attach pad 24.

The package body 28 is then cleaned to remove contaminants on the surface of the semiconductor die 30. Various known techniques are used to clean the package body 28, such as dry air blowing, plasma cleaning and carbon dioxide ($CO_2$) gas jet cleaning, as will be understood by those skilled in the art.

Figure 1G:
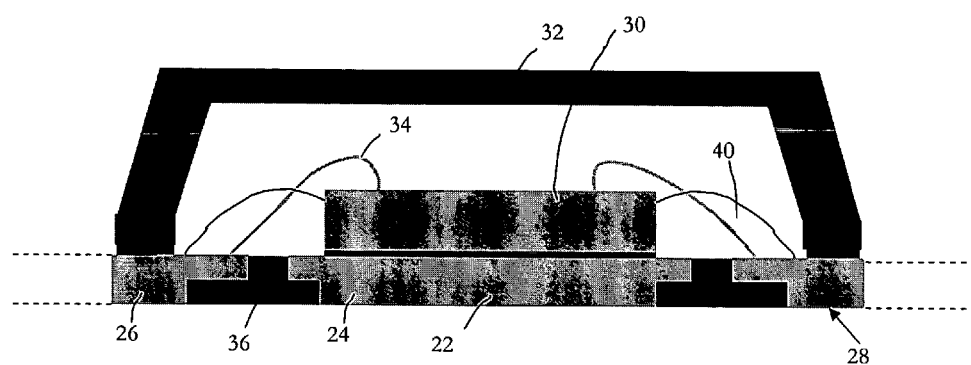

Referring now to FIG. 1G, the lid 32 is mounted on the package body 28 using epoxy, thereby sealing the semiconductor die 30 and the wire bonds 34 in an interior cavity. In the present embodiment, the lid 32 is suitably shaped with a cavity therein such that mounting the lid 32 on the substantially flat package body 28, provides the sealed cavity of the integrated circuit package 20. The lid is made of a suitable material such as a suitable molded plastic. Such plastics include, for example, a thermoset B-stage epoxy, a polyphenylene sulfide (PPS) or a liquid crystal polymer (LCP).

Figure 1H:
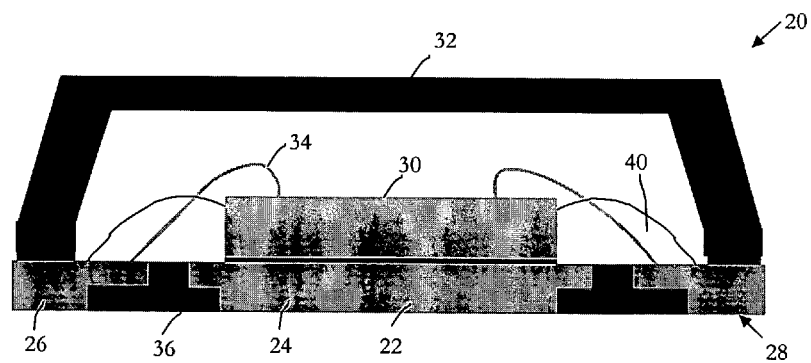

After mounting the lid, the package body is singulated by, for example, saw singulation, to produce the finished integrated circuit package 20, as shown in FIG. 1H.

Referring now to FIGS. 2A to 2G, a process for fabricating an integrated circuit package according to another embodiment of the present invention is provided. It will be appreciated that many of the process steps of the present embodiment are similar to those of the first described embodiment and therefore are not described again in detail.

Figure 2A:
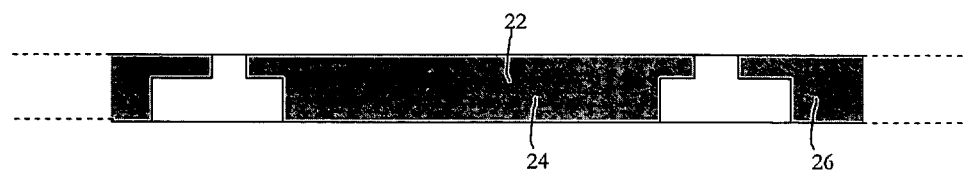
FIGS. 2A to 2H show processing steps for fabricating a cavity-type integrated circuit package according to another embodiment of the present invention.

Referring to FIG. 2A, a leadframe strip 22 is provided. As shown, the leadframe strip 22 is similar to the leadframe strip of the first described embodiment.

Figure 2B:
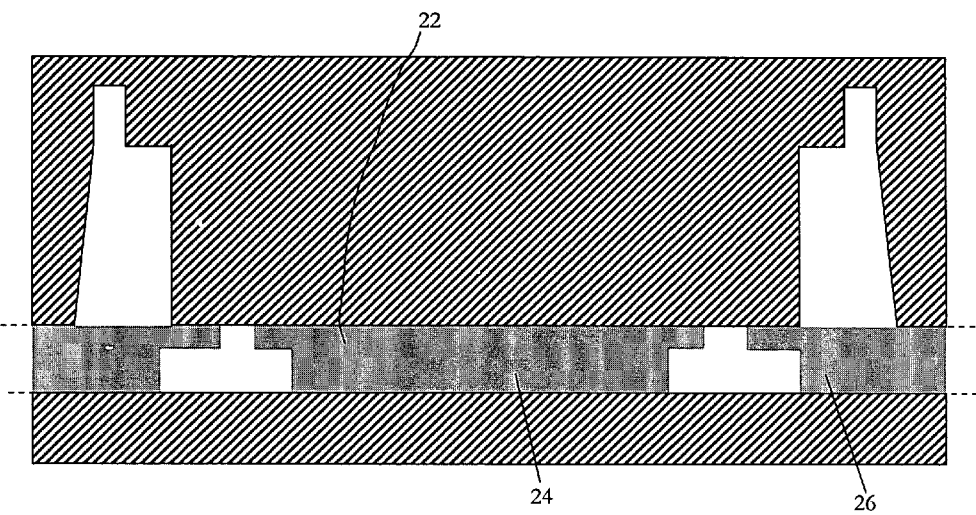

The leadframe strip 22 is supported in a mold by clamping the leadframe between upper and lower mold dies as shown in FIG. 2B. In the present embodiment, the upper mold die has a generally flat surface in contact with the upper surface of the die attach pad 24 and a portion of the upper surface of the contact pads 26. The upper mold die, however, is not in contact with the entire upper surface of the contact pads 26. Instead, the mold cavity is suitably shaped for molding a package body wall circumscribing the semiconductor die 24. The mold cavity is also suitably shaped to provide a ridge in the upper portion of the package body wall.

Similar to the first described embodiment, the lower mold die has a generally flat surface in contact with the lower surfaces of the die attach pad 24 and the contact pads 26.

Figure 2C:
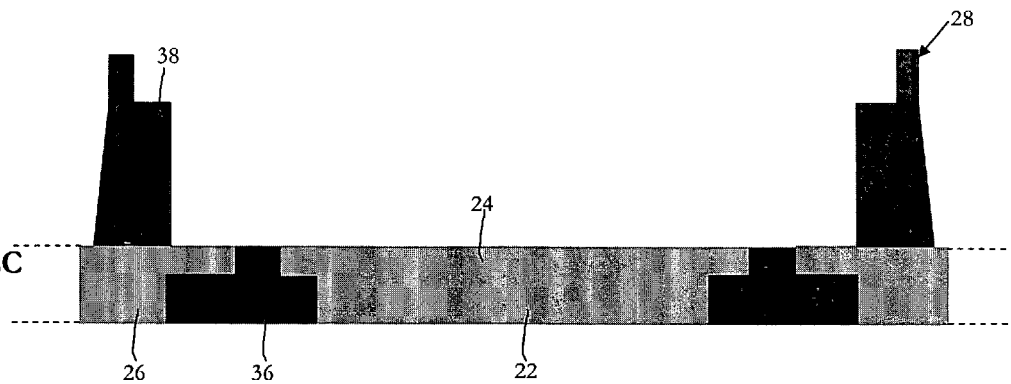
Figure 2D:
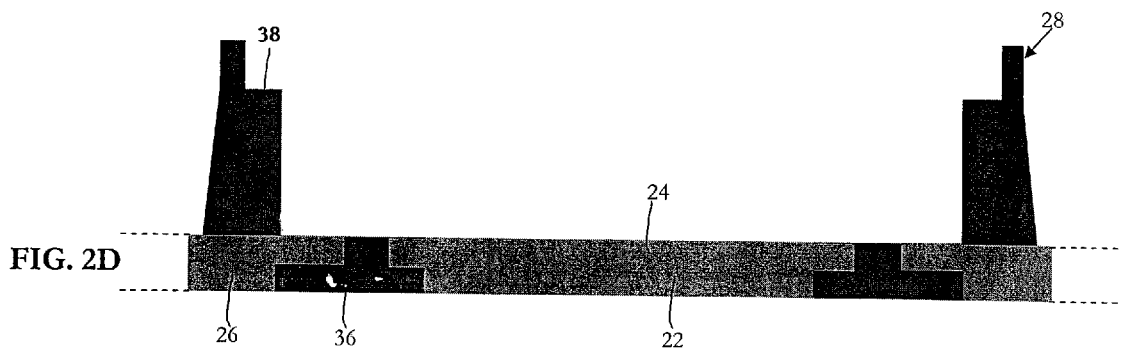

The package body 28 is then molded using a suitable molding material 36 and cured. The package body 28 is then removed from the mold. As shown in FIG. 2C, the resulting package body 28 includes the leadframe strip 22 and molding material 36 between the contact pads 26 and between the contact pads 26 and the die attach pad 24. The package body 28 also includes the package body wall 38 that circumscribes the die attach pad 24. Clearly, a ridge is provided in the upper portion of the package body wall 38. Thus, in the present embodiment, the package body 28 includes a cavity in which the die attach pad 24 is exposed and portions of the contact pads 26 are exposed.

A back surface of the package body 28 is then ground down using a wafer back grinding technique (FIG. 2D), as would be understood by those of skill in the art to grind the package body 28 to a suitable thickness.

Figure 2E:
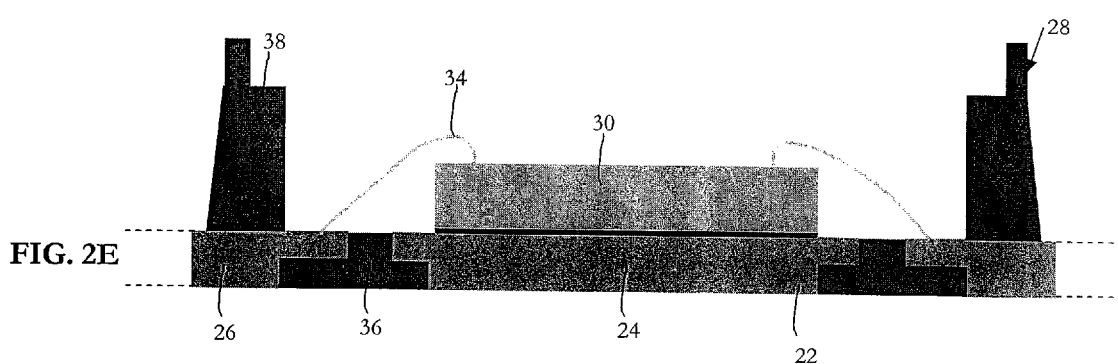

Next, a semiconductor die 30 is fixed to the die attach pad 24, followed by wire bonding of the contact pads 26 to the semiconductor die 30 (FIG. 2E). Clearly the wire bonds 34 are connected to interior portions of the contact pads 26 at portions of the contact pads 26 that are interior of the package cavity.

Figure 2F:
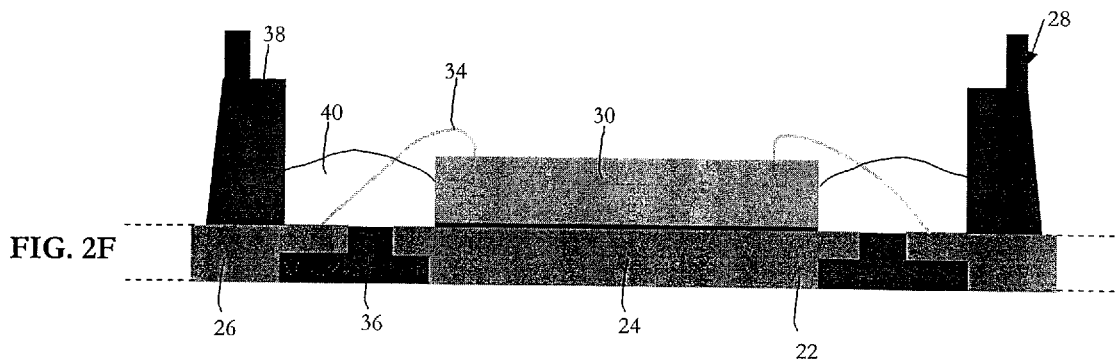

Referring now to FIG. 2F, a glob-top fill 40 is added to cover a portion of the wire bonds 34, at the contact pads 26, between the die attach pad 24 and the body wall 38. The glob-top fill 40 is an epoxy resin for mechanically supporting the package and protecting the wire bonds 34 and the die attach pad 24.

Figure 2G:
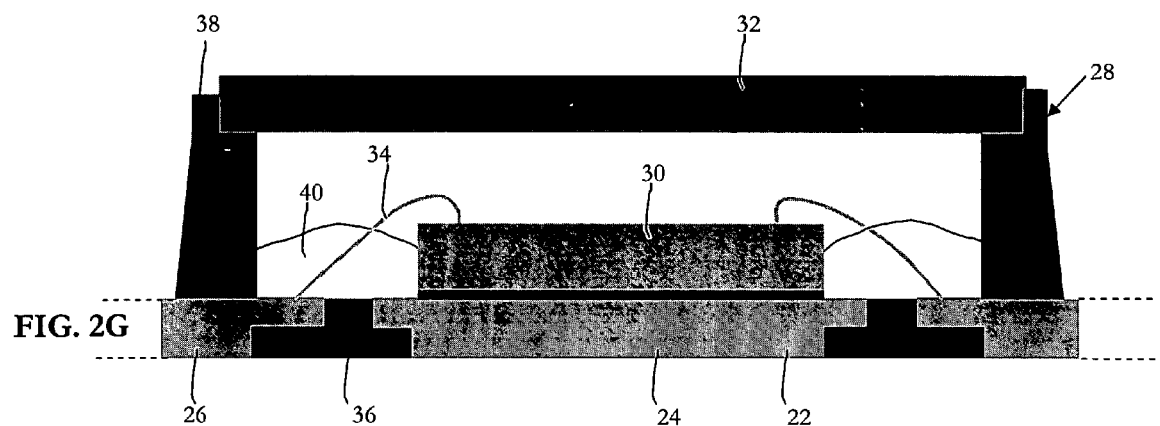

The package body 28 is then cleaned to remove contaminants on the surface of the semiconductor die 30 and the lid 32 is mounted on the package body 28 using epoxy, thereby sealing the semiconductor die 30 and the wire bonds 34 in an interior cavity (FIG. 2G). In the present embodiment, the lid 32 is generally flat and is epoxy mounted to the package body wall 38 interior of the ridge to thereby seal the cavity.

Figure 2H:
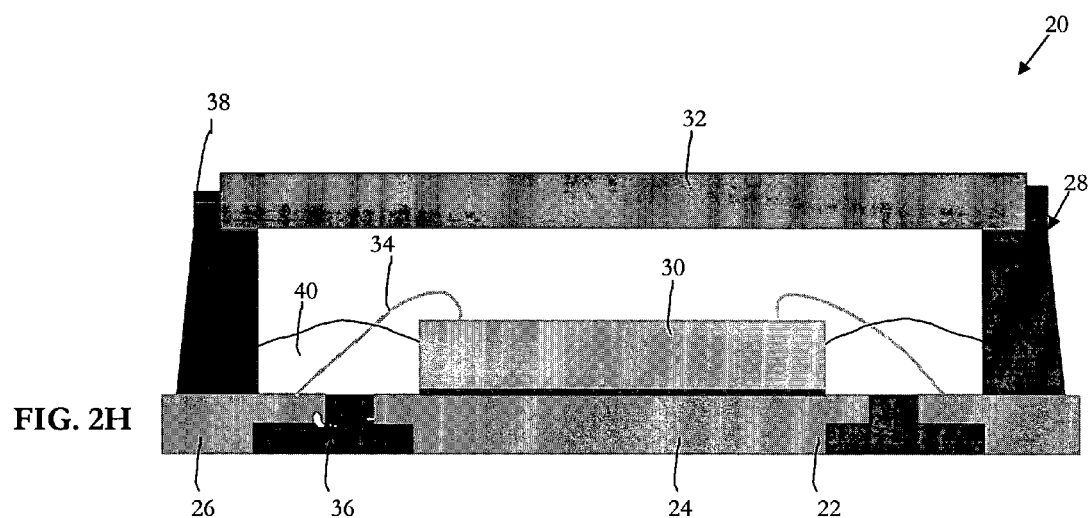

After mounting the lid, the package body is saw singulated to produce the finished integrated circuit package 20, as shown in FIG. 2H.

Specific embodiments of the present invention have been shown and described herein. However, modification and variations to these embodiments are possible. For example, other suitable lid materials are possible, including metal such as aluminum, copper, stainless steel, AlSiC and glass. Also, the lid can be attached using any suitable method such as epoxy attaching, ultrasonic organic bonding or ionic bonding of Silicon and Glass. Rather than saw singulating, the packages can be singulated by punch singulation. Although not shown, the leadframe strip generally includes a half etch feature of half etched leadframe for saw singulation purposes, as will be understood by those skilled in the art. Also, vent holes or external nozzles can be incorporated into the lid if desired. Still other modifications and variations may occur to those skilled in the art such as post attach features including rivet holes, or screw guide holes. All such modifications and variations are believed to be within the sphere and scope of the present invention.

What is claimed is:

1. A cavity-type integrated circuit package comprising:
   a premolded package body comprising a die attach pad, a plurality of contact pads and a molding material, an outer surface of said package body including an exposed surface of said die attach pad;
   a semiconductor die mounted to a first side of a die attach pad;
   a plurality of wire bonds connecting one or more of said contact pads and said semiconductor die; and
   an integrally formed lid mounted on said package body, wherein said package body is pre-molded into a shape of a substantially flat strip, and said lid is shaped to include a cavity therein, thereby enclosing said semiconductor die and said wire bonds in a sealed cavity defined by said package body and said lid.

2. The cavity-type integrated circuit package according to claim 1, wherein said molding material is disposed between said contact pads and between said die attach pad and said contact pads.

3. The cavity-type integrated circuit package according to claim 1, wherein said outer surface of said package body further includes exposed bottom and side surfaces of said contact pads.

4. The cavity-type integrated circuit package according to claim 1, further comprising a fill material covering a portion of the wire bonds.

* * * * *